(12) United States Patent
Funahashi et al.

(10) Patent No.: US 7,554,029 B2
(45) Date of Patent: Jun. 30, 2009

(54) COMPLEX OXIDE HAVING P-TYPE THERMOELECTRIC CHARACTERISTICS

(75) Inventors: Ryoji Funahashi, Ikeda (JP); Emmanuel Guilmeau, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 515 days.

(21) Appl. No.: 11/207,054

(22) Filed: Aug. 18, 2005

(65) Prior Publication Data

US 2006/0037638 A1 Feb. 23, 2006

(30) Foreign Application Priority Data

Aug. 18, 2004 (JP) ............................. 2004-237852

(51) Int. Cl.
*H01L 35/00* (2006.01)
*H01B 1/00* (2006.01)
(52) U.S. Cl. .................. 136/236.1; 136/238; 136/239; 136/240; 136/241; 136/205; 252/519.15; 252/519.3; 324/451; 505/100
(58) Field of Classification Search ............. 136/236.1, 136/238–241, 205; 252/519.15, 519.3; 324/451; 505/100
See application file for complete search history.

(56) References Cited

U.S. PATENT DOCUMENTS 6,091,014 A * 7/2000 Eklund et al. ............ 136/236.1

2002/0037813 A1 * 3/2002 Funahashi et al. ........... 505/100
2003/0084935 A1 * 5/2003 Bell ......................... 136/200
2004/0177800 A1 9/2004 Funahashi et al.
2005/0211289 A1 9/2005 Funahashi et al.
2006/0279901 A1 * 12/2006 Miyamoto et al. .......... 361/272

FOREIGN PATENT DOCUMENTS

JP 62003039 A 1/1987
JP 2001-019544 1/2001

(Continued)

OTHER PUBLICATIONS

Funahashi et al.: "Thermoelectric properties of Bi2Sr2Co2Ox polycrystalline materials" Applied Physics Letters, AIP, American Institute of Physics, Melville, NY, US, vol. 76, No. 17, Apr. 24, 2000, pp. 2385-2387, XP012025125 ISSN: 0003-6951.*

*Primary Examiner*—Alexa D Neckel
*Assistant Examiner*—Golam Mowla
(74) *Attorney, Agent, or Firm*—Westerman, Hattori, Daniels & Adrian, LLP.

(57) ABSTRACT

The present invention provides a novel complex oxide capable of achieving high performance as a p-type thermoelectric material. The complex oxide comprises a layer-structured oxide represented by the formula $Bi_aPb_bM^1_cCO_dM^2_eO_f$, wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, Ta, and Ag; $1.8 \leq a \leq 2.5$; $0 \leq b \leq 0.5$; $1.8 \leq c \leq 2.5$; $1.6 \leq d \leq 2.5$; $0 \leq e \leq 0.5$; and $8 \leq f \leq 10$; and at least one interlayer component selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$. The interlayer component being present between layers of the layer-structured oxide.

7 Claims, 6 Drawing Sheets

FOREIGN PATENT DOCUMENTS

| | | |
|---|---|---|
| JP | 2001-064021 | 3/2001 |
| JP | 2001-223393 | 8/2001 |
| JP | 2002-141562 | 5/2002 |
| JP | 2003-152230 | 5/2003 |
| JP | 2003-282964 | 10/2003 |
| JP | 2003-306381 | 10/2003 |
| WO | WO 03/000605 A1 | 1/2003 |
| WO | WO-2004/065669 A1 * | 8/2004 |
| WO | WO 2004/065669 A1 | 8/2004 |
| WO | WO 2004/077565 A1 | 9/2004 |

* cited by examiner

COMPLEX OXIDE HAVING P-TYPE THERMOELECTRIC CHARACTERISTICS

CROSS-REFERENCE TO RELATED APPLICATIONS

This application claim priority under 35 U.S.C. § 119 to Japanese Patent Application No. 2004-237852, files on Aug. 18, 2004, which is incorporated herein by reference.

TECHNICAL FIELD

The present invention relates to a complex oxide capable of achieving high performance as a p-type thermoelectric material, a p-type thermoelectric material comprising the complex oxide, and a thermoelectric module.

BACKGROUND OF THE INVENTION

In Japan, only 30% of the primary energy supply is used as effective energy, with about 70% being eventually lost to the atmosphere as heat. The heat generated by combustion in industrial plants, garbage-incineration facilities or the like is lost to the atmosphere without conversion into other energy. In this way, a vast amount of thermal energy is wastefully discarded, while acquiring only a small amount of energy by combustion of fossil fuels or other means.

To increase the proportion of energy to be utilized, the thermal energy currently lost to the atmosphere should be effectively used. For this purpose, thermoelectric conversion, which directly converts thermal energy to electrical energy, is an effective means. Such a thermoelectric conversion utilizes the Seebeck effect, and is an energy conversion method for generating electricity in which a difference in electric potential is produced by creating a difference in temperature between both ends of a thermoelectric material.

In such a method for generating electricity utilizing thermoelectric conversion, i.e., thermoelectric generation, electricity is generated simply by setting one end of a thermoelectric material at a location heated to a high temperature by waste heat, and the other end in the atmosphere (room temperature) and connecting conductive wires to both ends. This method entirely eliminates the need for moving parts such as the motors or turbines generally required for electric power generation. As a consequence, the method is economical and can be carried out without generating gases by combustion. Moreover, the method can continuously generate electricity until the thermoelectric material has deteriorated.

Therefore, thermoelectric generation is expected to play a role in the resolution of future energy problems. To realize thermoelectric generation, large amounts of a thermoelectric material that has a high thermoelectric conversion efficiency and excellent heat resistance, chemical durability, etc. are required.

Used as an index of thermoelectric conversion performance of materials is the dimensionless figure of merit (ZT) of a thermoelectric material given by a calculation based on the following equation:

$$ZT = S^2 T/\rho \kappa$$

wherein S is the Seebeck coefficient, T is the absolute temperature, $\rho$ is the electrical resistivity; and $\kappa$ is the thermal conductivity. It is known that the higher the figure of merit value, the higher the conversion efficiency.

As can be seen from the above formula, a high Seebeck coefficient S is effective for increasing the figure of merit (ZT). It is advantageous to lower other factors, such as the electrical resistivity and thermal conductivity.

$CoO_2$-based layered oxides, such as $Bi_2Sr_2Co_2O_9$, etc., have been previously reported as p-type thermoelectric materials that can be used at high temperatures in air (e.g., Japanese Patent Nos. 3069701, 3089301, and 3472814; Japanese Unexamined Patent Publication Nos. 2001-223393 and 2003-282964; and International Publication No. WO 03/000605). As materials capable of achieving further excellent thermoelectric conversion performance, materials have been demanded which has a low electrical resistivity and a low thermal conductivity as well as a high Seebeck coefficient.

SUMMARY OF THE INVENTION

The present invention has been made to solve the above problems. A principal object of the invention is to provide a novel complex oxide that achieves excellent performance as a p-type thermoelectric material.

The present inventors conducted extensive research to achieve the above object and found the following. A novel complex oxide can be obtained by inserting a specific component between layers of a layer-structured oxide with a specific composition serving as a base substance, which comprises Bi, Co, and O as essential elements and further comprises Pb, Sr, Ca, etc. The novel complex oxide has a positive Seebeck coefficient and has extremely low thermal conductivity. In particular, the inventors found that, as compared with the base substance, the novel complex oxide exhibits further lower thermal conductivity in the least at a temperature of about 100° C. (373 K) or higher, due to the presence of interlayer components inserted between layers of the oxide. The invention has been accomplished based on these findings.

More specifically, the present invention provides the following complex oxides, p-type thermoelectric materials comprising the complex oxides, and thermoelectric modules.

Item 1. A complex oxide comprising:

a layer-structured oxide represented by the formula $Bi_aPb_bM^1_cCo_dM^2_eO_f$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, Ta, and Ag; $1.8 \leq a \leq 2.5$; $0 \leq b \leq 0.5$; $1.8 \leq c \leq 2.5$; $1.6 \leq d \leq 2.5$; $0 \leq e \leq 0.5$; and $8 \leq f \leq 10$; and at least one interlayer component selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$;

the interlayer component being present between layers of the layer-structured oxide.

Item 2. A complex oxide according to Item 1, wherein an amount of said at least one component selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$ is 0.1 mol to 2 mols per mol of complex oxide represented by the formula $Bi_aPb_bM^1_cCo_dM^2_eO_f$.

Item 3. A complex oxide according to Item 1, which has a positive Seebeck coefficient at a temperature of 100 K or higher.

Item 4. A complex oxide according to Item 1, which has an electrical resistivity of 100 mΩcm or less at a temperature of 100 K or higher.

Item 5. A complex oxide according to Item 1, which has a thermal conductivity of 4 W/Km or less at a temperature of 300 K or higher.

Item 6. A p-type thermoelectric material comprising a complex oxide according to Item 1.

Item 7. A thermoelectric module comprising a p-type thermoelectric material according to Item 6.

DISCLOSURE OF THE INVENTION

Complex Oxide of the Invention

The complex oxide of the invention is structured such that at least one component (hereinafter sometimes referred to as a "interlayer component") selected from the group consisting of $F$, $Cl$, $Br$, $I$, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$ is present between layers of a layer-structured oxide represented by the formula $Bi_aPb_bM^1_cCo_dM^2_eO_f$ (hereinafter sometimes referred to as "base substance").

The layer-structured oxide is represented by the formula $Bi_aPb_bM^1_cCo_dM^2_eO_f$, wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids. Examples of lanthanoids include La, Ce, Pr, Nd, Sm, Eu, Gd, Tb, Dy, Ho, Er, Tm, Lu, etc. $M^2$ is one or more elements selected from the group consisting of Ti, V, Cr, Mn, Fe, Ni, Cu, Mo, W, Nb, Ta, and Ag. In the formula, the values of a, b, c, d, e, and f are as follows: $1.8 \leq a \leq 2.5$; $0 \leq b \leq 0.5$; $1.8 \leq c \leq 2.5$; $1.6 \leq d \leq 2.5$; $0 \leq e \leq 0.5$; and $8 \leq f \leq 10$.

The oxide represented by the formula $Bi_aPb_bM^1_cCo_dM^2_eO_f$ has a laminated structure with alternating rock-salt structure layers and $CoO_2$ layers wherein the rock-salt structure layers have the components Bi, $M^1$, and O in the ratio of $Bi_2M^1_2O_4$; and the $CoO_2$ layers have octahedrons with octahedral coordination of six O to one Co, the octahedrons being arranged two-dimensionally such that they share one another's sides. In the oxide with such a composition, some of the Bi is substituted by Pb or some of $M^1$, and some of the Co is substituted by $M^2$.

The complex oxide of the invention represented by the formula $Bi_aPb_bM^1_cCo_dM^2_eO_f$ comprises the interlayer component present between two BiO layers which are weakly bonded by van der Waals force. The interlayer component is at least one component selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$.

The amount of interlayer component is about 0.1 to 2 mols, preferably 0.1 to 1.2 mols, and more preferably about 0.5 to 1.2 mols, per mol of the oxide represented by the formula $Bi_aPb_bM^1_cCo_dM^2_eO_f$ i.e., per gram formula weight of the oxide represented by the formula. In this case, when the interlayer component is halogen, such as F, Cl, Br, or I, the molar amount is calculated as the amount of halogen molecule, such as $F_2$, $Cl_2$, $Br_2$, or $I_2$.

Figure 1:
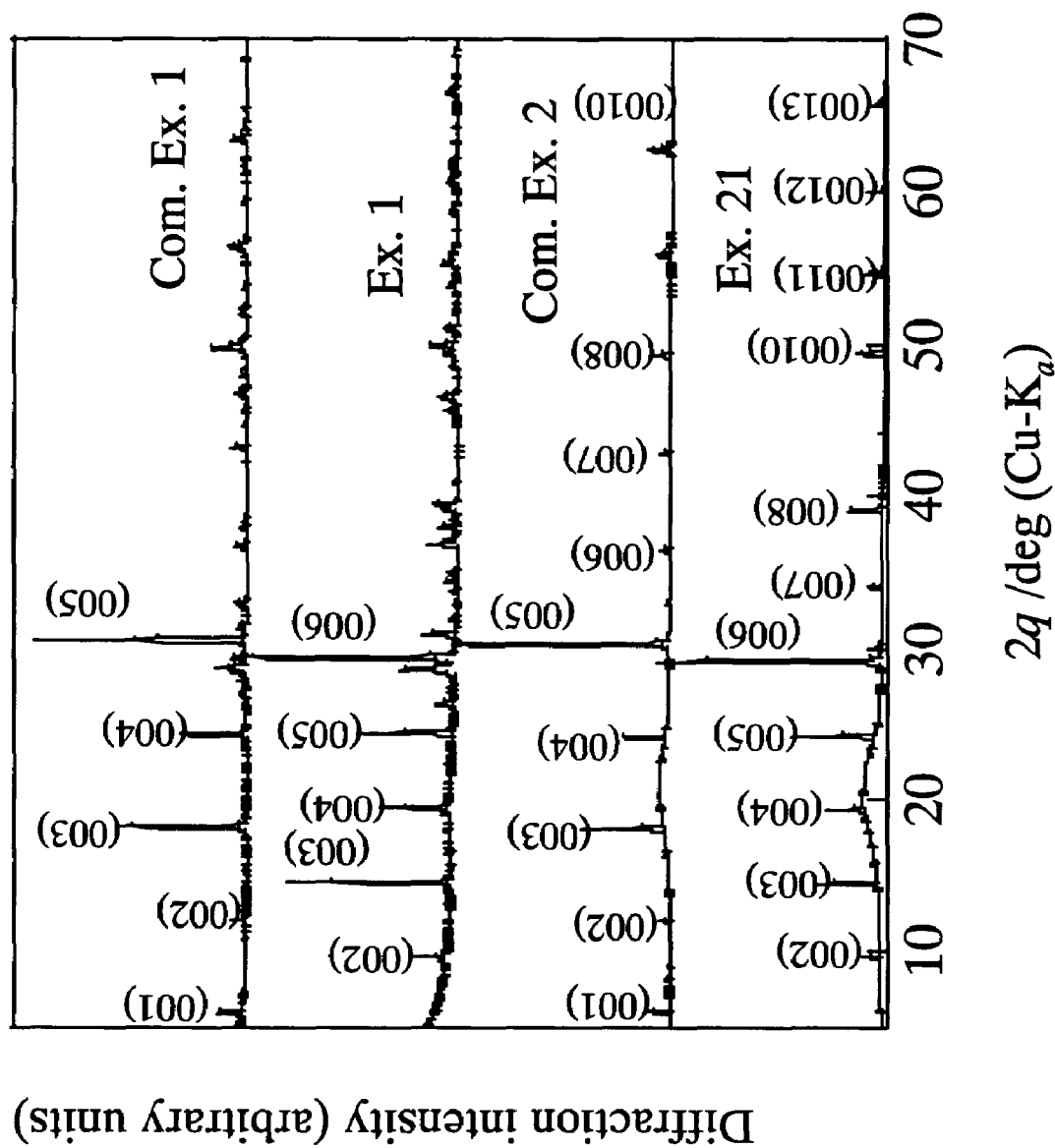
FIG. 1 shows x-ray diffraction patterns of the complex oxides of the invention (Examples 1 and 21) and the base substances thereof (Comparative Examples 1 and 2).

FIG. 1 shows X-ray diffraction patterns of the oxides of Example 1, Comparative Example 1, Example 21, and Comparative Example 2 which are described later. More specifically, Example 1 refers to a complex oxide structured such that iodine (I) is present between the layers of the oxide represented by the formula $Bi_{2.5}Ca_{2.5}Co_2O_{9.2}$; Comparative Example 1 refers to an oxide represented by the formula $Bi_{2.5}Ca_{2.5}CO_2O_{9.2}$, which is the base substance of the complex oxide of Example 1; Example 21 refers to a complex oxide structured such that iodine (I) is present between layers of a single-crystal oxide represented by the formula $Bi_{2.5}Sr_{1.7}Ca_{0.7}Co_2O_x$; and Comparative Example 2 refers to a single-crystal oxide represented by the formula $Bi_{2.5}Sr_{1.7}Ca_{0.7}Co_2O_x$, which is the base substance of the complex oxide of Example 21.

The X-ray diffraction patterns show that the diffraction angle of the complex oxide of the invention shifts significantly more at the peak indexed by (001) than at other peaks as compared with the base substance represented by the formula $Bi_aPb_bM^1_cCo_dM^2_eO_f$. The difference is remarkable in the X ray diffraction pattern of the single-crystal oxide of Example 21. This shows that the complex oxide of the invention is structured in such a manner that only the c-axis length is longer than that of the base substance represented by the formula $Bi_aPb_bM^1_cCo_dM^2_eO_f$.

Figure 2:
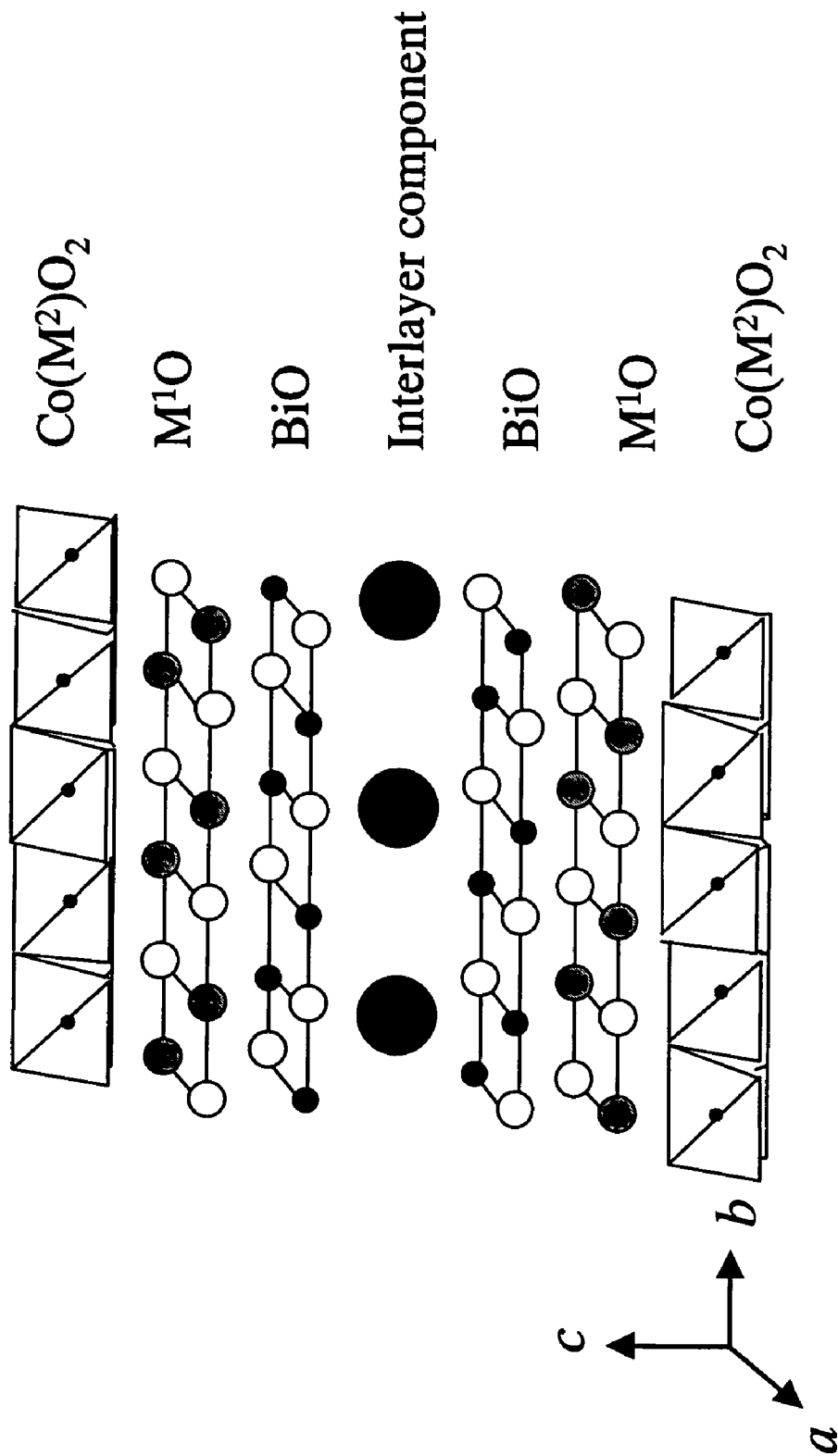
FIG. 2 is a view schematically showing the crystalline structure of a complex oxide of the invention.

FIG. 2 is a view schematically showing the crystalline structure of a complex oxide of the invention. As shown in FIG. 2, the complex oxide of the invention is structured such that the interlayer component is present between layers of the oxide represented by the formula $Bi_aPb_bM^1_cCo_dM^2_eO_f$.

The complex oxide of the invention has a positive Seebeck coefficient. When a difference in temperature is created between both ends of a material composed of the complex oxide, the electric potential generated by the thermoelectromotive force is higher at the low-temperature side than at the high-temperature side, and thus the complex oxide of the invention demonstrates properties as a p-type thermoelectric material. More specifically, the above-described complex oxide has a positive Seebeck coefficient at a temperature of 100K or higher.

The complex oxide of the invention is characterized especially by its low thermal conductivity, which is as low as about 4 W/Km or less in the least at a temperature of room temperature or higher, i.e., at a temperature of 300 K or higher. Although the complex oxides of the invention show somewhat different tendency of the thermal conductivity depending on the type of interlayer component inserted, the thermal conductivity thereof is still lower in the least at a temperature of 373 K or higher, as compared with the complex oxide represented by the formula $Bi_aPb_bM^1_cCo_dM^2_eO_f$ which does not contain the above-described interlayer component.

Moreover, the complex oxides of the invention have a favorable electrical conductivity with low electrical resistivity and exhibit an electrical resistivity of 100 mΩcm or lower at a temperature of 100 K or higher.

Process for Preparing the Complex Oxide of the Invention

There is no limitation to processes for preparing the complex oxides of the invention insofar as the process can produce a complex oxide in which the above-described specific interlayer component is present between layers of the layer-structured oxide represented by the formula $Bi_aPb_bM^1_cCo_dM^2_eO_f$.

Employable is a process comprising, for example, preparing the layer-structured oxide (base substance) represented by the formula $Bi_aPb_bM^1_cCo_dM^2_eO_f$, and inserting, into layers of the obtained layer-structured oxide, at least one component (interlayer component) selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$, thereby obtaining a target complex oxide of the invention.

Process for Preparing a Base Substance

Any single-crystalline or polycrystalline oxide represented by $Bi_aPb_bM^1_cCo_dM^2_eO_f$ is usable, and there are no limitations to the processes for preparing such oxides. Examples of known methods include single crystal-producing methods such as flux methods, zone-melting methods, crystal pulling methods, glass annealing methods via glass precursor, and the like; powder-producing methods such as solid phase reaction methods, sol-gel methods, and the like; film-forming methods such as sputtering methods, laser ablation methods, chemical vapor deposition methods, and the like; etc.

(i) Solid Phase Reaction Method

Among the above methods, a case where a solid phase reaction method is employed for preparing an oxide represented by the formula $Bi_aPb_bM^1_cCo_dM^2_eO_f$ is described below as an example of a process for preparing a polycrystalline complex oxide.

According to the solid phase reaction method, starting materials are mixed so as to have the same element ratio as in the desired oxide, and the mixture is sintered, thereby preparing a polycrystalline material represented by the formula $Bi_aPb_bM^1_cCo_dM^2_eO_f$.

The sintering temperature and the sintering time are not limited insofar as the desired oxide can be obtained. For example, sintering may be conducted at about 600° C. to about 1000° C. for about 10 to about 40 hours. When carbonates, organic compounds or the like are used as starting materials, the starting materials are preferably decomposed by calcination prior to sintering, and then sintered to give the desired oxide. For example, when carbonates are used as starting materials, they may be calcined at about 700° C. to about 900° C. for about 10 hours, and then sintered under the above-mentioned conditions. Sintering means are not limited, and any means, including electric furnaces and gas furnaces, may be used. Usually, sintering may be conducted in an oxidizing atmosphere such as in an oxygen stream or air. When the starting materials contain a sufficient amount of oxygen, sintering in, for example, an inert atmosphere is also possible. The amount of oxygen in a complex oxide to be produced can be controlled by adjusting the partial pressure of oxygen during sintering, sintering temperature, sintering time, etc. The higher the partial pressure of oxygen is, the higher the oxygen ratio in the above formulae can be. When a solid phase reaction method is employed for obtaining the desired complex oxide, the starting materials are preferably sintered in the form of a press-molded article, thereby efficiently promoting the solid phase reaction.

The starting materials are not limited insofar as they can produce oxides when sintered. Useful starting materials are metals, oxides, compounds (such as carbonates), etc. Examples of Bi sources include bismuth oxide ($Bi_2O_3$), bismuth carbonate ($Bi_2(CO_3)_3$), bismuth nitrate ($Bi(NO_3)_3$), bismuth chloride ($BiCl_3$), bismuth hydroxide ($Bi(OH)_3$), and alkoxide compounds such as trimethoxy bismuth ($Bi(OCH_3)_3$), triethoxy bismuth ($Bi(OC_2H_5)_3$), tripropoxy bismuth ($Bi(OC_3H_7)_3$), and the like, etc. Examples of Co sources include cobalt oxide ($Co_3O_4$), cobalt nitrate ($Co(NO_3)_2 \cdot 6H_2O$), cobalt chloride ($CoCl_2$), cobalt hydroxide ($Co(OH)_2$), alkoxides such as dimethoxy cobalt ($Co(OCH_3)_2$), diethoxy cobalt ($Co(OC_2H_5)_2$), dipropoxy cobalt ($Co(OC_3H_7)_2$), and the like, etc. Examples of usable sources of other elements similarly include metals, oxides, chlorides, carbonates, nitrates, hydroxides, alkoxides, and the like. Compounds containing two or more constituent elements of the complex oxide of the invention are also usable.

(ii) Solution Method

A polycrystalline oxide with a composition represented by the formula $Bi_aPb_bM^1_cCo_dM^2_eO_f$ can be obtained using a solution in which raw materials are dissolved. In this case, water-soluble compounds, such as nitrates and the like may be used as raw materials. Such raw materials are dissolved to form a solution so as to have a metal component molar ratio of $Bi:Pb:M^1:Co:M^2$ of 1.8-2.5:0-0.5:1.8-2.5:1.6-2.5:0-0.5. For example, employable is a process comprising heating and stirring such a solution in an alumina crucible to evaporate water, and then heating a residue at a temperature of about 600° C. to about 800° C. in air for about 10 hours to obtain calcined powder, and then sintering the calcined powder in the same manner as in the above-described solid phase reaction method.

(iii) Glass Annealing Method

As an example of preparing a single-crystalline substance, a description is given of a case where single-crystalline fibrous whiskers are produced according to a glass annealing method via glass precursor. In this method, starting materials are melted and rapidly cooled for solidification. Any melting conditions can be employed insofar as the starting materials can be uniformly melted. When an alumina crucible is used as a vessel for the melting operation, it is desirable to heat the starting materials to a temperature of about 1200° C. to about 1400° C. to prevent contamination with the vessel and to inhibit vaporization of the starting materials. The heating time is not limited, and the heating may be continued until a uniform melt is formed. Usually, the heating time is about 30 minutes to about 1 hour. The heating means are not limited, and any heating means can be employed, including electric furnaces, gas furnaces, etc. The melting can be conducted, for example, in an oxygen-containing atmosphere such as air or an oxygen stream. An oxygen stream adjusted to a flow rate of about 300 ml/min or less can be used. A flow rate of about 300 ml/min or higher is also acceptable. In the case of starting materials containing a sufficient amount of oxygen, the melting may be conducted in an inert atmosphere.

The rapid cooling conditions are not limited. The cooling may be conducted to the extent that at least the surface of the solidified product becomes a glassy amorphous layer. For example, the melt can be rapidly cooled by allowing the melt to flow over a metal plate and compressing the melt from above. The cooling rate is usually about 500° C./sec or greater, and preferably $10^{3}$° C./sec or greater.

Subsequently, the product solidified by rapid cooling is heat-treated in an oxygen-containing atmosphere, whereby fibrous single crystals of the desired oxide grow from the surface of the solidified product.

The heat treatment temperature may be in the range of about 800° C. to about 950° C. The heat treatment can be conducted in an oxygen-containing atmosphere such as in air or an oxygen stream. When the heat treatment is effected in an oxygen stream, the stream may be adjusted to a flow rate of, for example, about 300 ml/min or less, although a flow rate of about 300 ml/min or higher is acceptable. The heat treatment time is not limited and can be determined according to the intended degree of growth of the single crystal. The heat treatment time is usually about 60 to about 1000 hours.

The mixing ratio of the starting materials can be determined depending on the chemical composition of the desired oxide. More specifically, when a fibrous complex oxide single crystal is formed from the amorphous layer on the surface of the solidified product, the oxide single crystal that grows has the composition of the solid phase in phase equilibrium with the amorphous layer, which is considered a liquid phase, of the surface part of the solidified product. Therefore, the mixing ratio of the starting materials can be determined based on the relationship of the chemical compositions between the solid phase (single crystal) and the liquid phase (amorphous layer) in phase equilibrium.

The size of the oxide single crystal thus obtained depends on the kind of starting materials, composition ratio, heat treatment conditions, and so on. The single crystal may be fibrous, for example, having a length of about 10 μm to about 1000 μm, a width of about 20 μm to about 200 μm, and a thickness of about 1 μm to about 5 μm.

In any of the solid phase reaction method, the solution method, and the glass annealing method via glass precursor, the amount of oxygen contained in the obtained product can be controlled according to the flow rate of oxygen during sintering. The higher the flow rate of oxygen is, the greater the amount of oxygen in the product can be. However, variation in the amount of oxygen in the product does not seriously affect the reactivity when an interlayer component is inserted between layers of the complex oxide or the characteristics of the obtained complex oxide.

Process for Inserting an Interlayer Component

An interlayer component is inserted between layers of the layer-structured oxide (base substance) by bringing the component into contact with the base substance in a gaseous, liquid, or solid phase. The interlayer component is at least one component selected from the group consisting of F, Cl, Br, I, $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, and $PbI_2$.

In order to insert in a gaseous phase the interlayer component between layers of the base substance, the interlayer component in a gaseous state may be allowed to come into contact with the base substance, for example, in an environment where the interlayer component can exist in the gaseous phase. More specifically, a process may be employed which comprises placing the starting materials for the interlayer component and the base substance in a suitable sealed container, such as a glass tube, and heating the contents and/or depressurizing the inside of the container in such a manner that the starting materials for the interlayer component become gaseous. In the case of an airtight container, it is desirable to depressurize the inside of the container so as not to excessively raise the inner pressure.

When the interlayer component is a halogen element, such as F, Cl, Br, or I, usable as starting materials for the interlayer component are halogen molecules or halogen-containing substances from which a halogen molecule is produced by heating or depressurization, etc., such as alkyl halides including methyl halides, etc. When the interlayer component is a halide such as $HgF_2$, $HgCl_2$, $HgBr_2$, $HgI_2$, $TlF_3$, $TlCl_3$, $TlBr_3$, $TlI_3$, $BiF_3$, $BiCl_3$, $BiBr_3$, $BiI_3$, $PbF_2$, $PbCl_2$, $PbBr_2$, or $PbI_2$, the halide to be inserted between layers may be sublimated, or liquefied and evaporated, thereby obtaining a gaseous halide.

The starting material(s) for the interlayer component may be in contact with the base substance, or only the gaseous phase of the interlayer component and the base substance may be in contact with each other in such a manner that the starting material(s) itself does not contact the base substance.

The amount of interlayer component inserted generally depends on the treatment temperature, reaction period of time, etc. Usually, as the treatment temperature and the reaction time increase, the amount of the interlayer component inserted increases.

The treatment temperature may be within a range in which the interlayer component exists in a gaseous state. More specifically, although the specific temperature varies depending on the type of interlayer component, treatment pressure, etc., the temperature is generally in the range of room temperature to about 700° C., and preferably about 100° C. to about 500° C.

The treatment period of time may be suitably set depending on the treatment temperature and the amount of the interlayer component to be inserted, and is usually about 30 minutes to about 240 hours.

After the heat treatment, some of the interlayer components that are not inserted between layers usually adhere to the surface of the oxide. In this case, the oxide may be washed using a solvent which dissolves just the component adhered to the surface without dissolving the complex oxide and which does not draw out the interlayer component inserted between layers. Examples of such solvents include ethanol, water, toluene, hexane, etc.

In order to insert in a liquid phase the interlayer component between layers of the base substance, the interlayer component may be made to contact the base substance by allowing a melt or a solution of the interlayer component to contact the base substance. In such a process, stirring may be optionally conducted so as to promote the reaction.

In the case of using a melt of the interlayer component, substances which melt without decomposition or sublimation during heating are usable as starting materials.

When a halogen element such as F, Cl, Br, or I is inserted between layers, an aqueous solution containing a water-soluble halide, such as an alkaline metal halide, may be used. The concentration of the aqueous solution may be, for example, about 0.01 mol/l to about 5 mol/l.

The treatment temperature is not limited, and, for example in the case of using a melt of the interlayer component, may be higher than the melting point of the interlayer component and lower than the temperature for decomposition or evaporation. In the case of an aqueous solution, the temperature may be room temperature to about 80° C.

The treatment period of time varies depending on the treatment temperature and the desired amount to be inserted, and, for example, the treatment may be conducted about a day to about for one week.

Under the conditions where a solid starting material containing the interlayer component does not melt even with heating, the interlayer component can be inserted into the base substance by a solid phase reaction. More specifically, the solid starting material for the interlayer component is sufficiently mixed with the base substance for sufficient contact. The treatment temperature may be about 100° C. to about 700° C. The treatment period of time varies depending on the treatment temperature and the desired amount to be inserted, and, for example, may be about a day to about for ten days.

The amount of starting material(s) for the interlayer component is not limited, and can be selected from a wide range. For example, the amount can be selected from a range of about 0.01 parts by weight to about 10 parts by weight per one part by weight of the base substance in any case where the reaction is carried out in a gaseous, liquid, or solid state.

Properties and Applications of the Complex Oxide of the Invention

The complex oxides of the invention have a positive Seebeck coefficient at a temperature of 100 K or higher, and have a low electrical resistivity of 100 mΩcm or less, and also have a thermal conductivity as low as 4 W/Km or less in the least at a temperature of 300 K or higher, and therefore can be effectively used as a p-type thermoelectric material.

Figure 3:
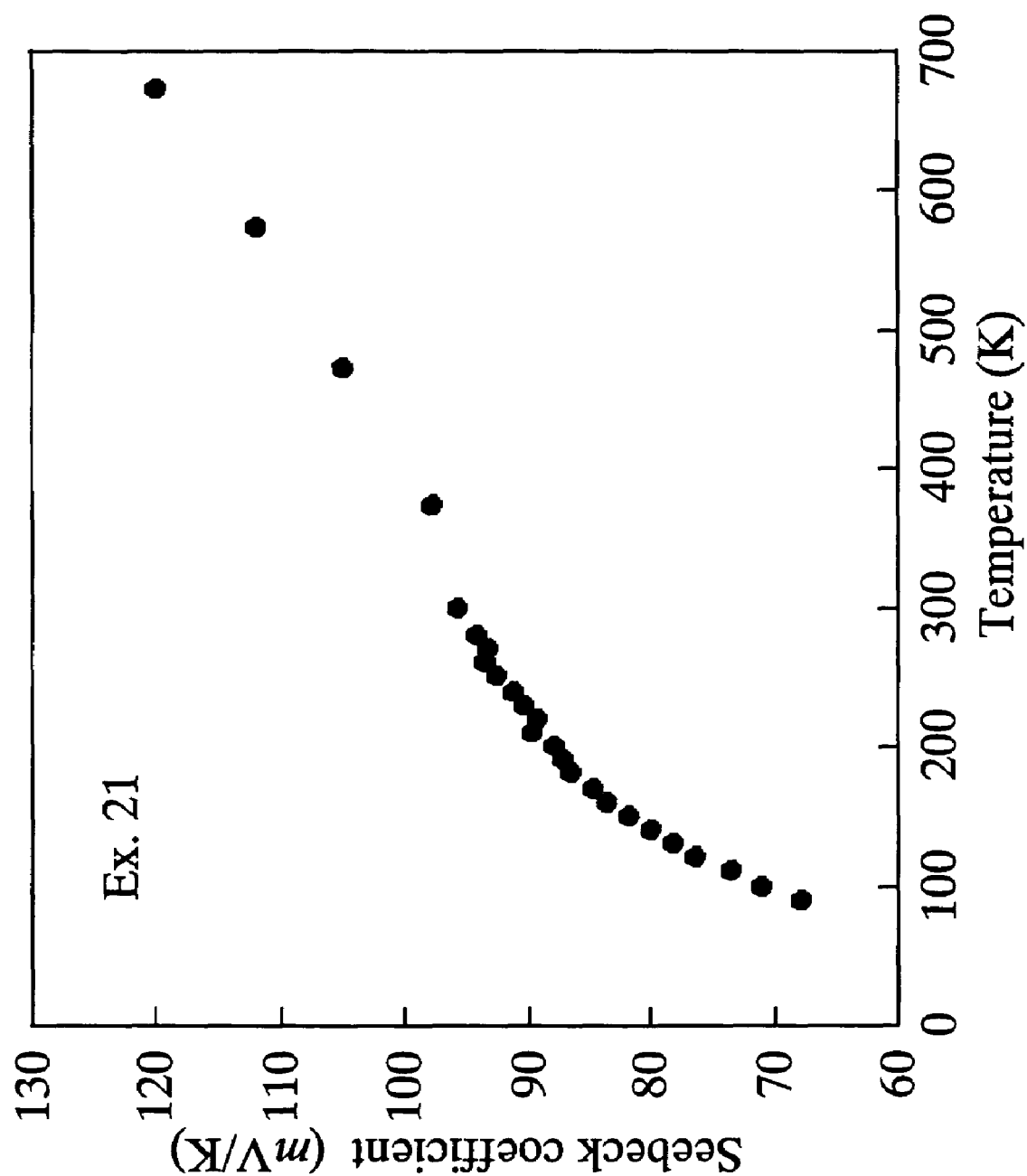
FIG. 3 is a graph showing the temperature dependency of the Seebeck coefficient of the complex oxide obtained in Example 21.

FIG. 3 is a graph showing the temperature dependency of the Seebeck coefficient of the complex oxide obtained in Example 21 described later. FIG. 3 shows that the complex oxide has a positive Seebeck coefficient at a temperature of 100 K or higher. The complex oxides obtained in other Examples also have positive Seebeck coefficients at temperatures of 100 K to 673 K (400° C.), and have properties as p-type thermoelectric materials.

Figure 4:
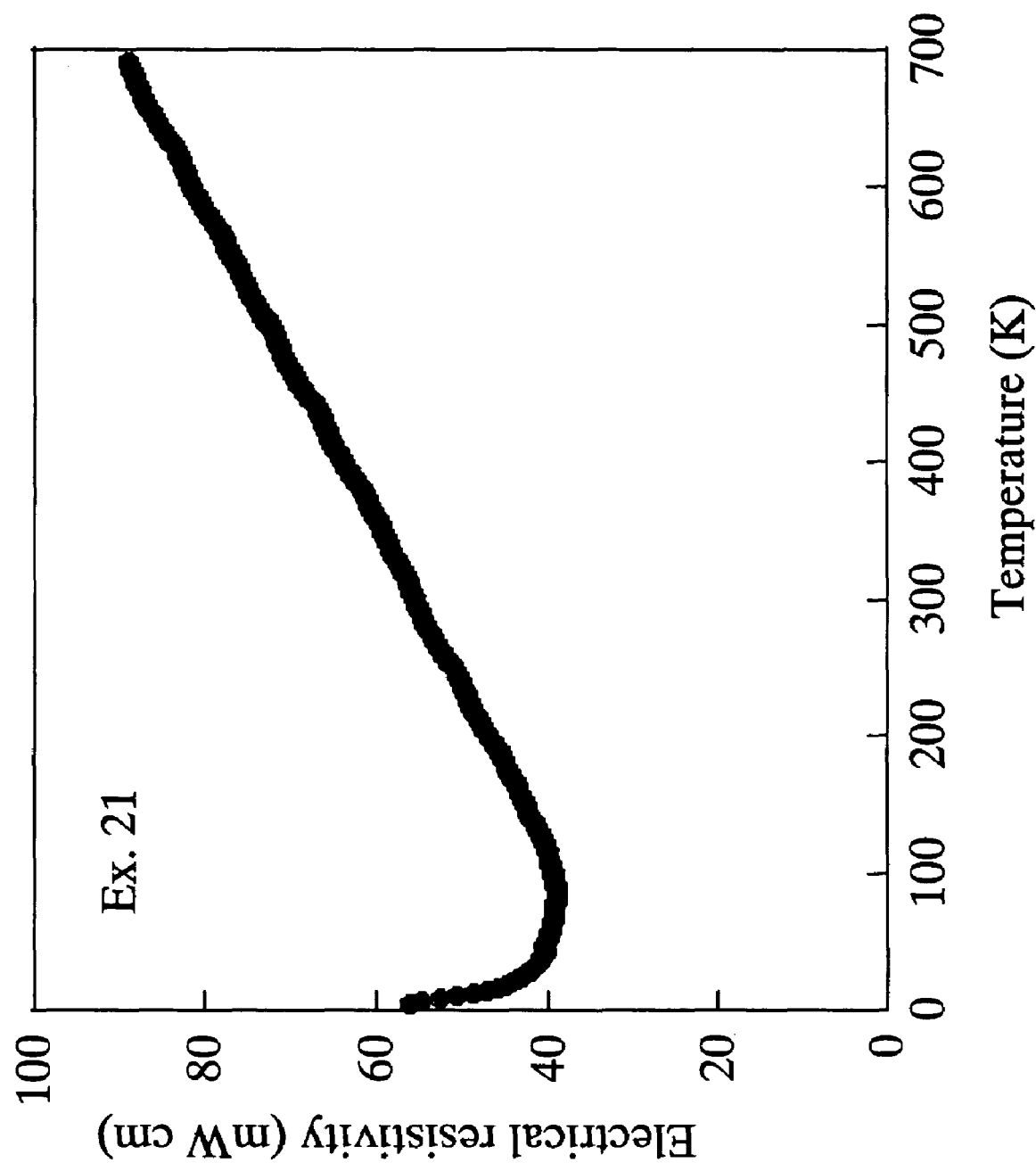
FIG. 4 is a graph showing the temperature dependency of the electrical resistivity of the complex oxide obtained in Example 21.

FIG. 4 is a graph showing the temperature dependency of the electrical resistivity of the complex oxide obtained in Example 21. FIG. 4 shows that the electrical resistivity of the complex oxide tends to increase with temperature elevation at a temperature of 100 K or higher. Such a complex oxide is an excellent electrical conductor with an electrical resistivity of 100 mΩcm or less at temperatures of 100 K to 673 K. Although some of the complex oxides obtained in other Examples exhibit no temperature dependency or exhibit a tendency of reducing electrical resistivity with temperature elevation, all of the complex oxides have an electrical resistivity of 100 mΩcm or less at a temperature of 100 K to 673 K (400° C.) and therefore serve as an excellent electrical conductor.

Figure 5:
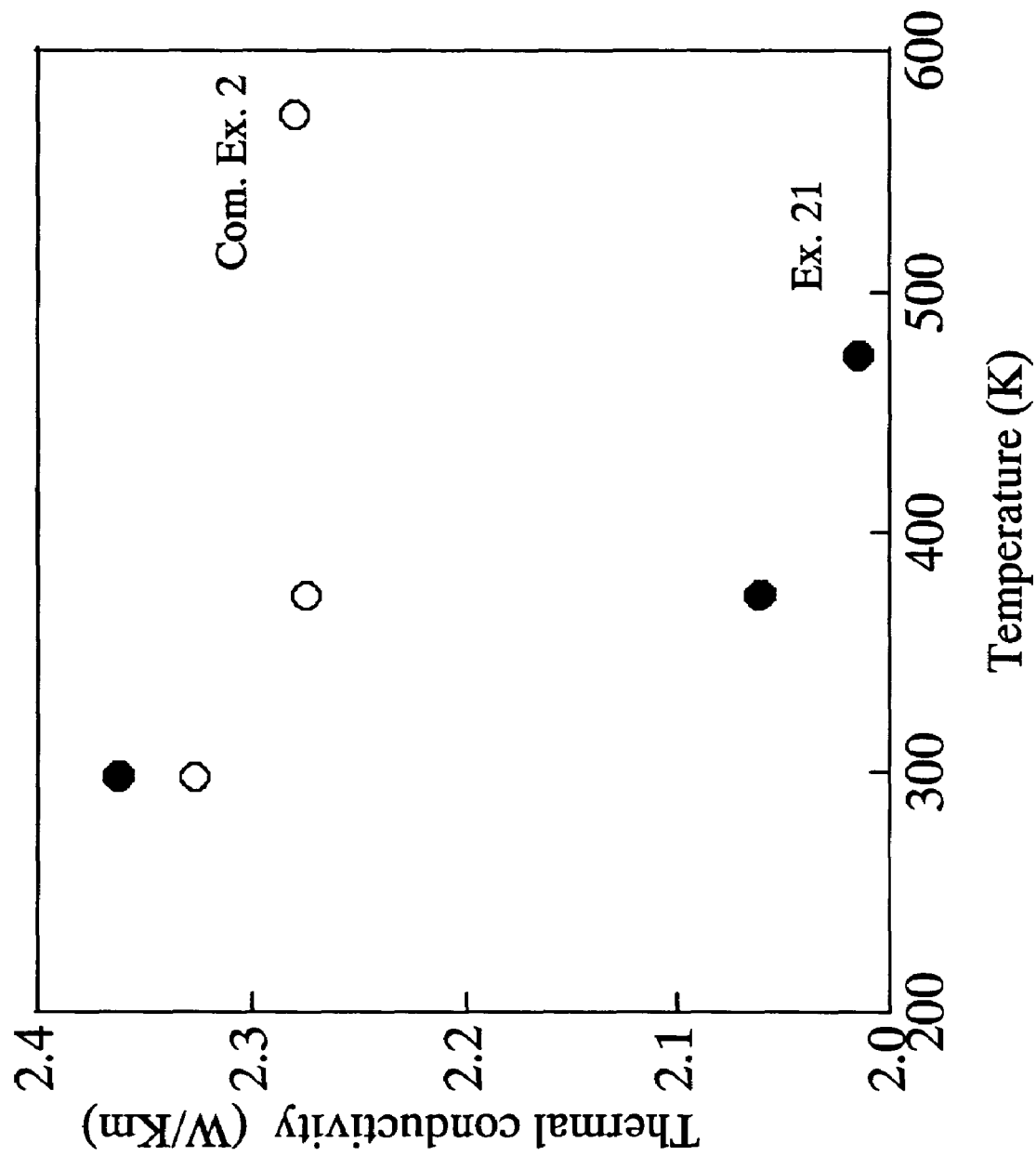
FIG. 5 is a graph showing the temperature dependency of the thermal conductivity of the complex oxide obtained in Example 21.

FIG. 5 is a graph showing the temperature dependency of thermal conductivity with respect to the complex oxide obtained in Example 21 and a single crystalline oxide (comparative example 2) represented by $Bi_{2.5}Sr_{1.7}Ca_{0.7}Co_2O_x$ as a base substance of the complex oxide. As can be seen from FIG. 5, the complex oxide has a thermal conductivity as low as 4 W/Km or less at a temperature of 300 K or higher, and has much lower thermal conductivity at a temperature of 373 K or higher as compared with the base substance. Other Examples have a thermal conductivity of 4 W/Km or less at a temperature of 300 K to 673 K.

As can be seen from the above, the complex oxide of the invention has a positive Seebeck coefficient, an excellent electrical conductivity, and low thermal conductivity. Furthermore, the complex oxide has good heat resistance, chemical durability, etc. By utilizing such properties, the complex oxides of the invention can be effectively used as a p-type thermoelectric material for high-temperature use in air.

Figure 6:
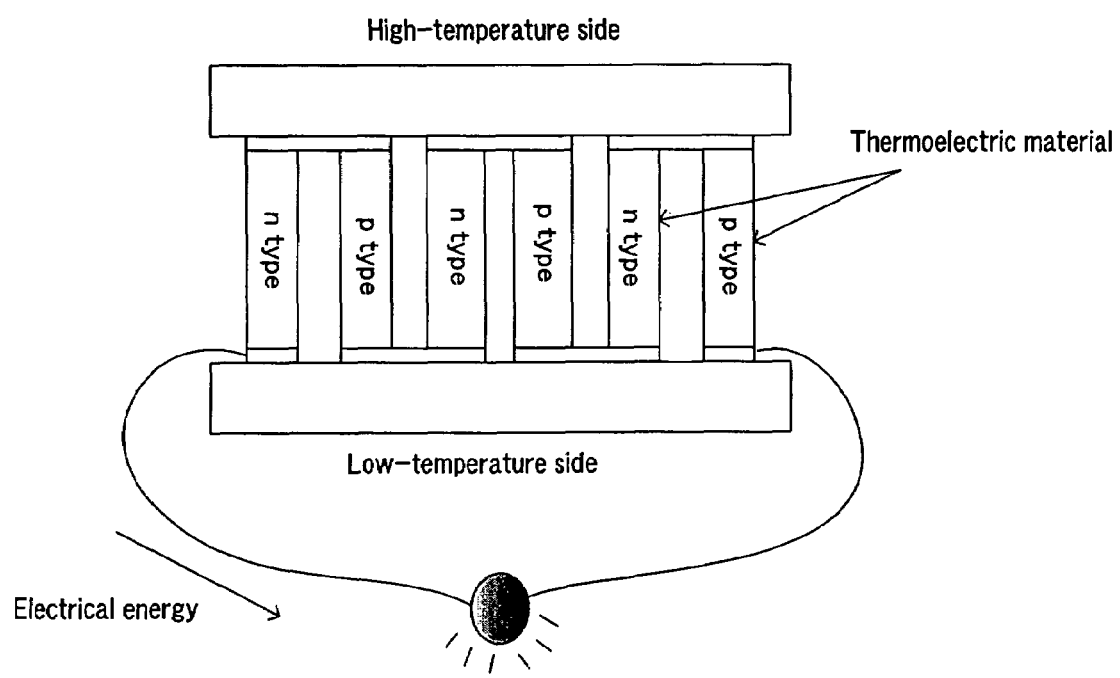
FIG. 6 is a view schematically showing a thermoelectric module comprising a complex oxide of the invention as a thermoelectric material.

FIG. 6 schematically shows an example of a thermoelectric module using a thermoelectric element comprising a sintered complex oxide of the invention as a p-type thermoelectric material. The thermoelectric module has a similar structure to conventional thermoelectric modules and comprises a high-temperature side substrate, a low-temperature side substrate, p-type thermoelectric materials, n-type thermoelectric materials, electrodes, and conductive wires. In such a module, the complex oxide of the invention is used as a p-type thermoelectric material.

EFFECT OF THE INVENTION

The complex oxides of the invention have a positive Seebeck coefficient, a low electrical resistivity, and low thermal conductivity, and exhibit excellent thermoelectric performance.

The complex oxides of the invention with such properties can be effectively utilized as p-type thermoelectric materials which are usable at high temperatures in air, whereas such use is impossible with conventional thermoelectric materials composed of intermetallic compounds. In particular, the complex oxides of the invention can serve as thermoelectric materials with higher thermoelectric conversion efficiencies than those of thermoelectric materials composed of $CoO_2$-based complex oxides that have heretofore been expected to serve as p-type thermoelectric materials.

Accordingly, by incorporating the complex oxides of the invention as p-type thermoelectric materials into a thermoelectric module, it becomes possible to effectively utilize thermal energy conventionally lost to the atmosphere.

EXAMPLES

Hereinafter, the present invention is described in more detail with reference to the following Examples.

Example 1

Using bismuth oxide ($Bi_2O_3$) as a source of Bi, calcium carbonate ($CaCO_3$) as a source of Ca, and cobalt oxide ($CO_3O_4$) as a source of Co, these starting materials were well mixed at a Bi:Ca:Co ratio (element ratio) of 2.5:2.5:2.0. The mixture was placed into an alumina crucible and calcined in air using an electric furnace at 800° C. for 10 hours to decompose the carbonate. The calcinate was milled and molded by pressing, followed by sintering in a 300 ml/minute oxygen stream at 850° C. for 20 hours, thereby preparing an oxide. The sintered oxide thus obtained was cut into a rectangular shape with a base of 5 mm×5 mm and a height of 30 mm using a diamond cutter, giving a sample.

About 2 g of this oxide and about 1 g of $I_2$ particles were put into a glass tube with an inner volume of 30 cm$^3$ so as not to be in contact with each other, the internal pressure was depressurized to about 10 Pa, and the contents of the glass tube were heated at 120° C. and maintained at 120° C. for 50 hours.

Thereafter, the result was cooled to room temperature and $I_2$ particles adhered to the oxide surface were removed using ethanol.

The complex oxide obtained had an X-ray diffraction pattern as shown in FIG. 1. In the complex oxide, iodine (I) was present between the layers of the oxide represented by $Bi_{2.5}Ca_{2.5}CO_2O_{9.2}$, and the proportion of iodine was 0.6 mol as $I_2$ per mol of the above oxide.

Examples 2 to 20

Starting materials were mixed at the element ratios as shown in Tables 1 and 2, and the same procedure as in Example 1 was then conducted to provide base substances of complex oxides. An interlayer component was inserted between BiO—BiO layers by a gaseous phase reaction method as in Example 1.

Tables 1 and 2 show the formulae of the oxides (base substances) used in the Examples, the weight ratios of the base substances to the starting materials for the interlayer components, and the heating temperatures and the heating time of periods at the time of insertion of the interlayer components.

Tables 1 and 2 also show the types of interlayer components, inserted amounts (mol) of the interlayer components per mol of base substance, measurement results of the Seebeck coefficients and electrical resistivities at 300 K, and measurement results of the thermal conductivities at 373 K, with respect to the complex oxides with the interlayer component inserted.

The starting materials for the interlayer components used in the following Examples are as follows:
F source: $F_2$ (fluorine)
Cl source: $Cl_2$ (chlorine)
Br source: $Br_2$ (bromine)
I source: $I_2$ (iodine)
$HgF_2$ source: $HgF_2$ (mercury fluoride)
$HgCl_2$ source: $HgCl_2$ (mercury chloride)
$HgBr_2$ source: $HgBr_2$ (mercury bromide)
$HgI_2$ source: $HgI_2$ (mercury iodide)
$TlF_3$ source: $TlF_3$ (thallium fluoride)
$TlCl_3$ source: $TlCl_3$ (thallium chloride)
$TlBr_3$ source: $TlBr_3$ (thallium bromide)
$TlI_3$ source: $TlI_3$ (thallium iodide)
$BiF_3$ source: $BiF_3$ (bismuth fluoride)
$BiCl_3$ source: $BiCl_3$ (bismuth chloride)
$BiBr_3$ source: $BiBr_3$ (bismuth bromide)
$BiI_3$ source: $BiI_3$ (bismuth iodide)
$PbF_2$ source: $PbF_2$ (lead fluoride)
$PbCl_2$ source: $PbCl_2$ (lead chloride)
$PbBr_2$ source: $PbBr_2$ (lead bromide)
$PbI_2$ source: $PbI_2$ (lead iodide)

TABLE 1

Polycrystalline materials

| Example | Composition of base substance | Base substance Starting material for interlayer component (weight ration) | Heating temperature/ Heating period | Type of interlayer component/inserted amount (mol) (per mol of base substance) | Seeback coefficient at 300 K ($\mu$V/K) | Electrical resistivity at 300 K (m$\Omega$cm) | Thermal conductivity at 373 K (W/Km) |
|---|---|---|---|---|---|---|---|
| 1 | Bi:Ca:Co:O = 2.5:2.5:2.0:9.3 | 2:1 | 120° C./ 50 hours | I/0.6 (as $I_2$) | 96 | 58 | 1.1 |
| 2 | Bi:Ca:Co:O = 2.5:2.5:2.0:9.3 | 1:1 | 120° C./ 20 hours | I/0.28 (as $I_2$) | 108 | 10 | 1.2 |
| 3 | Bi:Ca:Co:O = 2.5:2.5:2.0:9.3 | 1:1 | 400° C./ 100 hours | $HgBr_2$/0.5 | 100 | 90 | 1.1 |
| 4 | Bi:Ca:Co:O = 2.5:2.5:2.0:9.3 | 1:1 | 400° C./ 50 hours | HgBr2/0.2 | 87 | 70 | 1.0 |
| 5 | Bi:Ca:Co:O = 2.5:2.5:2.0:9.3 | 2:1 | 120° C./ 50 hours | Br/0.6 (as $Br_2$) | 100 | 55 | 0.9 |
| 6 | Bi:Ca:Co:O = 2.5:2.5:2.0:9.3 | 1:2 | 300° C./ 100 hours | $HgI_2$/0.6 | 105 | 95 | 1.0 |
| 7 | Bi:Ca:Co:O = 2.5:2.5:2.0:9.3 | 2:1 | 400° C./ 100 hours | $HgCl_2$/0.2 | 98 | 80 | 1.1 |
| 8 | Bi:Ca:Co:O = 2.5:2.5:2.0:9.3 | 1:2 | 300° C./ 50 hours | $TlI_2$0.4 | 90 | 85 | 1.0 |
| 9 | Bi:Sr:Co:O = 2.5:2.5:2.0:9.3 | 1:1 | 400° C./ 200 hours | $HgBr_2$/1.0 | 105 | 95 | 0.9 |
| 10 | Bi:Sr:Co:O = 2.5:2.5:2.0:9.3 | 1:1 | 300° C./ 100 horus | $BiI_3$/0.3 | 92 | 88 | 1.1 |

TABLE 2

Polycrystalline materials

| Example | Composition of base substance | Base substance Starting material for interlayer component (weight ration) | Heating temperature/ Heating period | Type of interlayer component/inserted amount (mol) (per mol of base substance) | Seeback coefficient at 300 K ($\mu$V/K) | Electrical resistivity at 300 K (m$\Omega$cm) | Thermal conductivity at 373 K (W/Km) |
|---|---|---|---|---|---|---|---|
| 11 | Bi:Sr:Co:O = 2.5:2.5:2.0:9.3 | 1:2 | 400° C./ 200 hours | $BiBr_3$/1.1 | 99 | 92 | 1.2 |
| 12 | Bi:Ba:Co:O = 2.0:2.0:2.0:8.9 | 2:1 | 300° C./ 50 hours | $PbI_2$/0.5 | 89 | 84 | 1.0 |
| 13 | Bi:Ca:Co:0 = 2.0:2.0:2.0:8.9 | 1:1 | 300° C./ 100 hours | $PbI_2$/1.0 | 97 | 90 | 1.1 |
| 14 | Bi:Ba:Co:O = 2.0:2.0:2.0:8.9 | 1:2 | 400° C./ 200 hours | $PbBr_2$/1.0 | 98 | 92 | 1.0 |
| 15 | Bi:Sr:Co:O = 2.0:2.0:2.0:9.0 | 1:1 | 120° C./ 20 hours | Br/0.5 (as $Br_2$) | 100 | 40 | 0.9 |
| 16 | Bi:Pb:Sr:Co:O = 2.0:0.2:2.0:2.0:9.1 | 2:1 | 120° C./ 50 hours | I/0.6 (as $I_2$) | 105 | 45 | 0.8 |
| 17 | Bi:Pb:Ca:Co:O = 2.0:0.2:2.0:2.0:9.0 | 1:1 | 400° C./ 200 hours | $HgBr_2$/1.1 | 100 | 80 | 0.9 |

TABLE 2-continued

Polycrystalline materials

| Example | Composition of base substance | Base substance Starting material for interlayer component (weight ration) | Heating temperature/ Heating period | Type of interlayer component/inserted amount (mol) (per mol of base substance) | Seeback coefficient at 300 K ($\mu$V/K) | Electrical resistivity at 300 K (m$\Omega$cm) | Thermal conductivity at 373 K (W/Km) |
|---|---|---|---|---|---|---|---|
| 18 | Bi:Sr:Ca:Co:O = 2.0:1.5:0.5:2.0:9.1 | 1:1 | 400° C./ 200 hours | HgBr$_2$/0.8 | 102 | 88 | 1.0 |
| 19 | Bi:Sr:Ca:Oo:O = 2.0:1.0:1.0:2.0:9.0 | 1:1 | 400° C./ 200 hours | HgBr$_2$/1.0 | 100 | 92 | 1.1 |
| 20 | Bi:Sr:Ca:Co:O = 2.0:0.5:1.5:2.0:9.1 | 1:2 | 400° C./ 200 horus | HgBr$_2$/1.0 | 105 | 95 | 0.9 |

Example 21

Using bismuth oxide (Bi$_2$O$_3$) as a source of Bi, strontium carbonate (SrCO$_3$) as a source of Sr, calcium carbonate (CaCO$_3$) as a source of Ca, and cobalt oxide (Co$_3$O$_4$) as a source of Co, these starting materials were well mixed at a Bi:Sr:Ca:Co ratio (element ratio) of 1.0:1.0:1.0:1.0. The mixture was charged into an alumina crucible and was heated in air using an electric furnace at a temperature of 1300° C. for 30 minutes to give a melt.

The melt was quickly sandwiched between copper plates, and was rapidly cooled to give a glassy solid. The glassy solid was placed on an aluminum boat and heat-treated in a 300 ml/min oxygen stream at 900° C. for 100 hours.

Whiskers of oxide growing from the glassy solid surface were collected using tweezers. The average composition of the whiskers was Bi$_{2.5}$Sr$_{1.7}$Ca$_{0.7}$Co$_2$O$_x$.

30 mg of the whiskers and 30 mg of I$_2$ particles were put into a glass tube with an inner volume of 5 cm$^3$ so as not to be in contact with each other, the internal pressure was depressurized to about 10 Pa. The contents of the glass tube were heated at 120° C. and maintained at 120° C. for 50 hours to insert iodine between layers of the oxide by a gaseous phase reaction method.

In the complex oxide obtained, iodine (I) was present between the layers of the oxide (base substance) with an average composition of Bi$_{2.5}$Sr$_{1.7}$Ca$_{0.7}$Co$_2$O$_{9.3}$, and the proportion of iodine was 0.55 mol as I$_2$ per mol of the above oxide.

Examples 22 to 28

In the same manner as in Example 21, whiskers of oxides were produced, and then interlayer components were inserted between BiO—BiO layers by a gaseous phase reaction method.

Table 3 shows the formulae of the oxide whiskers (base substances) used in the Examples, the weight ratios of the base substances to the starting materials for the interlayer components, and the heating temperatures and the heating time of periods at the time of insertion of the interlayer components.

Table 3 also shows the types of interlayer components, inserted amounts (mol) of the interlayer components per mol of base substances, measurement results of the Seebeck coefficients and electrical resistivities at 300 K, and measurement results of the thermal conductivities at 373 K, with respect to the complex oxides with the interlayer component inserted.

TABLE 3

Single-crustalline whiskers

| Example | Composition of base substance | Base substance Starting material for interlayer component (weight ration) | Heating temperature/ Heating period | Type of interlayer component/inserted amount (mol) (per mol of base substance) | Seeback coefficient at 300 K ($\mu$V/K) | Electrical resistivity at 300 K (m$\Omega$cm) | Thermal conductivity at 373 K (W/Km) |
|---|---|---|---|---|---|---|---|
| 21 | Bi:Sr:Ca:Co:O = 2.5:1.7:0.7:2.0:9.4 | 1:1 | 120° C./ 50 hours | I/0.55 (as I$_2$) | 98 | 45 | 2.1 |
| 22 | Bi:Sr:Ca:Co:O = 2.5:1.7:0.7:2.0:9.4 | 2:1 | 120° C./ 20 hours | I/0.28 (as I$_2$) | 110 | 8 | 2.0 |
| 23 | Bi:Sr:Ca:Co:O = 2.4:1.6:0.7:2.0:9.3 | 1:2 | 400° C./ 100 hours | HgBr$_2$/0.6 | 105 | 85 | 2.1 |
| 24 | Bi:Sr:Ca:Co:O = 2.3:1.7:0.8:2.0:9.4 | 1:2 | 400° C./ 50 hours | HgBr$_2$/0.2 | 85 | 70 | 2.2 |
| 25 | Bi:Sr:Ca:Co:O = 2.5:1.7:0.7:2.0:9.4 | 1:1 | 400° C./ 200 hours | BiCl$_3$/0.7 | 100 | 88 | 2.1 |
| 26 | Bi:Sr:Ca:Co:O = 2.4:1.6:0.7:2.0:9.3 | 1:2 | 300° C./ 200 hours | BiI$_3$/1 | 98 | 90 | 2.0 |
| 27 | Bi:Sr:Ca:Co:O = 2.4:1.6:0.7:2.0:9.3 | 1:1 | 400° C./ 200 hours | PbBr$_2$/0.5 | 80 | 50 | 1.9 |

TABLE 3-continued

| | | Single-crustalline whiskers | | | | | |
|---|---|---|---|---|---|---|---|
| Example | Composition of base substance | Base substance Starting material for interlayer component (weight ration) | Heating temperature/ Heating period | Type of interlayer component/inserted amount (mol) (per mol of base substance) | Seeback coefficient at 300 K ($\mu$V/K) | Electrical resistivity at 300 K (m$\Omega$cm) | Thermal conductivity at 373 K (W/Km) |
| 28 | Bi:Sr:Ca:Co: O= 2.5:1.7:0.7:2.0:9.4 | 1:2 | 300° C./ 100 hours | PbI$_2$/0.3 | 85 | 52 | 2.2 |

What is claimed is:

1. A complex oxide comprising:

a layer-structured oxide represented by the formula $Bi_aPb_bM^1_cCo_dM^2_eO_f$ wherein $M^1$ is one or more elements selected from the group consisting of Na, K, Li, Ti, V, Cr, Mn, Fe, Ni, Cu, Zn, Pb, Ca, Ba, Al, Y, and lanthanoids; $M^2$ is one or more elements selected from the group consisting of Ti, V, Cr, Mn, Fe, Ni, Cu, Mo, W, Nb, Ta, and Ag; $1.8 \leq a \leq 2.5$; $0 \leq b \leq 0.5$; $1.8 \leq c \leq 2.5$; $1.6 \leq d \leq 2.5$; $0 \leq e \leq 0.5$; and $8 \leq f \leq 10$; and at least one interlayer component selected from the group consisting of F, Cl, Br, I, HgF$_2$, HgCl$_2$, HgBr$_2$, HgI$_2$, TlF$_3$, TlCl$_3$, TlBr$_3$, TlI$_3$, BiF$_3$, BiCl$_3$, BiBr$_3$, BiI$_3$, PbF$_2$, PbCl$_2$, PbBr$_2$, and PbI$_2$;

the interlayer component being present between layers of the layer-structured oxide.

2. A complex oxide according to claim 1, wherein an amount of said at least one component selected from the group consisting F, Cl, Br, I, HgF$_2$, HgCl$_2$, HgBr$_2$, HgI$_2$, TlF$_3$, TlCl$_3$, TlBr$_3$, TlI$_3$, BiF$_3$, BiCl$_3$, BiBr$_3$, BiI$_3$, PbF$_2$, PbCl$_2$, PbBr$_2$, and PbI$_2$ is 0.1 mol to 2 mols per mol of complex oxide represented by the formula $Bi_aPb_bM^1_cCo_dM^2_eO_f$.

3. A complex oxide according to claim 1, which has a positive Seebeck coefficient at a temperature of 100 K or higher.

4. A complex oxide according to claim 1, which has an electrical resistivity of 100 m$\Omega$cm or less at a temperature of 100 K or higher.

5. A complex oxide according to claim 1, which has a thermal conductivity of of 4 W/Km or less at a temperature of 300 K or higher.

6. A p-type thermoelectric material comprising a complex oxide according to claim 1.

7. A thermoelectric module comprising a p-type thermoelectric material according to claim 6.

* * * * *